United States Patent [19]

Yasuda

[11] Patent Number: 4,687,949

[45] Date of Patent: Aug. 18, 1987

[54] SIGNAL TRANSMISSION CIRCUIT IN A SEMICONDUCTOR INTEGRATED CIRCUIT

[75] Inventor: Hiroshi Yasuda, Tokyo, Japan

[73] Assignee: Kabushiki Kaisha Toshiba, Kawasaki, Japan

[21] Appl. No.: 795,256

[22] Filed: Nov. 5, 1985

[30] Foreign Application Priority Data

Nov. 14, 1984 [JP] Japan ................................. 59-240208

[51] Int. Cl.$^4$ ..................... H03K 17/56; H03K 5/13; H03K 5/159; H03K 17/28

[52] U.S. Cl. .................................... 307/246; 307/594; 307/601; 307/606

[58] Field of Search ............... 307/246, 601, 594, 605, 307/606; 357/71, 85

[56] References Cited

U.S. PATENT DOCUMENTS 4,389,429 6/1983 Soclof .................................. 427/90

FOREIGN PATENT DOCUMENTS 0194552 11/1982 Japan ..................................... 357/71

OTHER PUBLICATIONS

Patent Abstracts of Japan, vol. 6, No. 47 (E-99)[925], Mar. 26th, 1982; & JP-A-56 161 668 (HItachi Seisakusho K.K.), 12-12-1981.

Japanese Journal of Applied Physics Supplements, 15th Conference on Solid-State Devices and Materials 1983, pp. 269-272, Tokyo, JP; T. Sakurai et al., "Double Word Line and Bit Line Structure for VLSI RAMs—Reduction of Word Line & Bit Line Delay".

Primary Examiner—Stanley D. Miller
Assistant Examiner—M. R. Wambach
Attorney, Agent, or Firm—Finnegan, Henderson, Farabow, Garrett & Dunner

[57] ABSTRACT

A signal transmission circuit includes an input pad for receiving an input signal, a resistor connected at one end to the input pad, and a signal transmission line connected at the input end to the other end of the resistor, and at the output end to an internal circuit. The signal transmission circuit further includes an auxiliary line connected at the input end to the input pad, floating electrically at the output end, and extending substantially in parallel with the transmission line.

7 Claims, 10 Drawing Figures

SIGNAL TRANSMISSION CIRCUIT IN A SEMICONDUCTOR INTEGRATED CIRCUIT

BACKGROUND OF THE INVENTION

The present invention relates to a signal transmission circuit used in a semiconductor integrated circuit.

In integrated circuits, it is often required to deliver a signal over substantially the total area of the semiconductor chip, or to transmit a signal from a first point on the chip to a second point far distanced from the first point. This being the case, a relatively long transmission line is used. This long transmission line is usually composed of a resistive metal having the smallest possible resistance, such as aluminum. A large stray capacitance typically exists between the metal transmission line and the silicon substrate or other such conductive layer. The longer the transmission line, the larger the stray capacitance. This stray capacitance delays propagation of a signal through the transmission line, and hence adversely influences the operating characteristics of the integrated circuit.

As shown in FIG. 1, an input signal is supplied to an input pad 1 formed on an IC chip 2. The signal is further transmitted to an internal circuit 5 through a protective resistor 3 and a long interconnection line or a signal transmission line 4. The protective resistor 3 protects the internal circuit 5 from an abnormally high voltage accidentally applied to the input pad 1. For this reason, the protective resistor 3 has a high resistance, usually 1 to 2 kilo ohms. The resistor 3, in combination with the stray capacitance associated with the transmission line 4, operates to greatly delay propagation of the signal through the transmission line 4.

Referring to FIG. 2, the stray capacitance associated with the transmission line 4 is the sum of the capacitance C1 between the transmission line 4 and the semiconductor substrate 6, and the capacitance C2 between the transmission line 4 and its adjacent interconnection lines 7. In an integrated circuit of a high circuit density, the distance between the lines 4 and 7 is short. The stray capacitance associated with the transmission line 4, therefore, is effectively influenced by the stray capacitance C2. Thus, as the interconnection lines are laid closer to each other, the stray capacitance associated with the transmission line 4 becomes larger, lowering the signal propagating speed.

SUMMARY OF THE INVENTION

Accordingly, an object of the present invention is to provide a signal transmission circuit which effectively reduces the stray capacitance associated with a signal transmission line during signal transmission, thereby achieving high-speed signal transmission.

To achieve the above object, there is provided a signal transmission circuit comprising a signal transmission line formed on a semiconductor integrated circuit chip, an auxiliary line capacitively coupled with the transmission line, and a signal supplying circuit for supplying the first input signal to the transmission line, and for supplying, to the input end of the auxiliary line, a second input signal changing in the same direction as the first input signal, but at a greater rate of change.

Because the second input signal changes in the same direction as the first input signal, but at a greater rate of change, the effective value of capacitance between the transmission and the auxiliary lines becomes negative, to thereby reduce the stray capacitance associated with the transmission line. Therefore, transmission speed of the first signal on the transmission line is improved.

DETAILED DESCRIPTION OF THE PREFERRED EMBODIMENT

Figure 1:
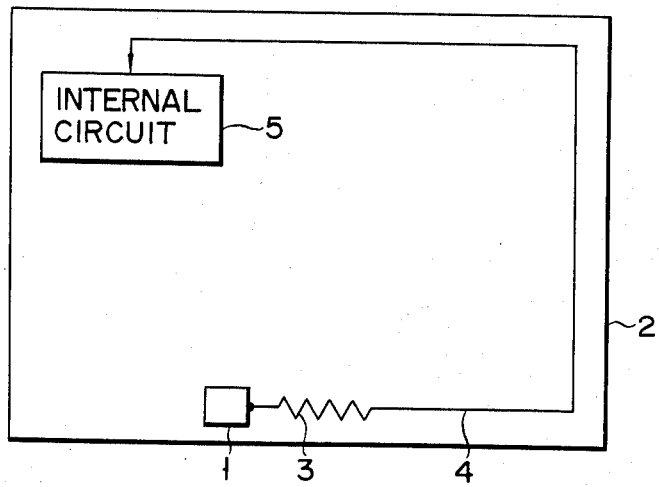
FIG. 1 schematically illustrates a signal transmission circuit of the prior art.
Figure 2:
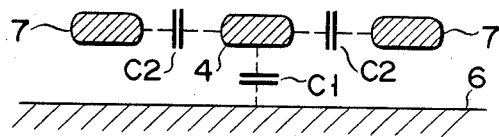
FIG. 2 illustrates stray capacitances among a transmission line, a substrate and adjacent interconnection lines in the circuit of FIG. 1.

The inventor of the present invention has studied how the effective value of the stray capacitance associated with the signal transmission line on an IC chip varies while the IC circuit is operating. As already described referring to FIG. 2, because the substrate potential is fixed, the stray capacitance C1 existing between the transmission line 4 and the substrate 6 has a constant value The effective value of the capacitance C2 existing between the interconnection lines 4 and 7 varies depending upon the potential difference $\Delta V$ between these interconnection lines 4 and 7 and the signal current i flowing through the transmission line 4. It is assumed that, when the interconnection line 7 is held at a given voltage, the effective value of the stray capacitance C2 will have a fixed value CO. On this assumption, if the potentials between the interconnection lines 4 and 7 vary at an equal rate of change in opposite directions, the effective value of the capacitance C2 will be 2CO. If these potentials vary at an equal rate of change in the same direction, the effective value of the capacitor C2 will be 0. When the potentials on the lines 7 and 4 vary in the same direction, but the rate of change of the former is two times that of the latter, the stray capacitance C2 is $-CO$, and the effective value of the total of the stray capacitances associated with the transmission line 4 becomes small. Therefore, a signal can be propagated on the transmission line 4 at a higher speed.

Figure 3:
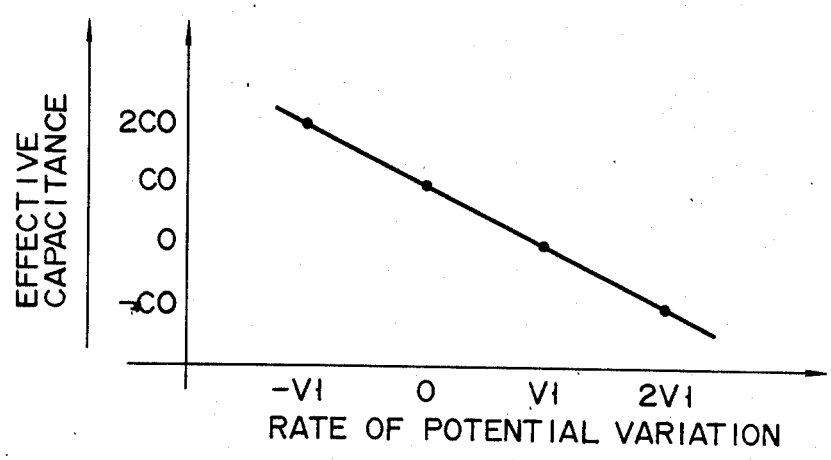
FIG. 3 shows a graph illustrating an effective value of the stray capacitance, between two transmission lines, against the ratio of change rates of signals which propagate through these transmission lines.

FIG. 3 shows the relationship between the effective value of stray capacitance C2 and the variation rate of the potential on line 7 when the potential on the line 4 is changed at a predetermined rate of variation V1. As seen, to reduce the effective value of the stray capacitance associated with the transmission line 4, it is necessary to vary the potential on the line 7 in the same direction as the potential on the line 4, but at a larger rate of change.

The conclusion deduced from the above fact is that the signal propagating speed on the transmission line 4 can be increased by appropriately changing the potential on the interconnection line or the adjacent line 7 in connection with a potential variation on the line 4.

Figure 4:
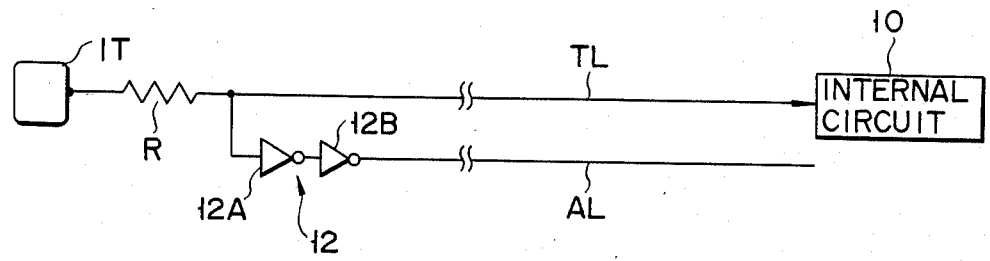
FIG. 4 is a circuit diagram of a signal transmission circuit according to an embodiment of the present invention.

FIG. 4 shows a signal transmission circuit according to an embodiment of the present invention. The signal transmission circuit includes a transmission line TL and an auxiliary line AL. A signal, which is supplied to an input terminal IT and passed through a protective resistor R, is transmitted to an internal circuit 10 by this signal transmission circuit. The auxiliary line AL is laid substantially in parallel with the transmission line TL. The input end of the auxiliary line AL is connected to the output terminal of a wave shaping circuit 12. This wave shaping circuit 12, which includes inverters 12A and 12B, shapes a waveform of the signal from the protective resistor R. The output end of the auxiliary line AL floats electrically.

Figure 5:
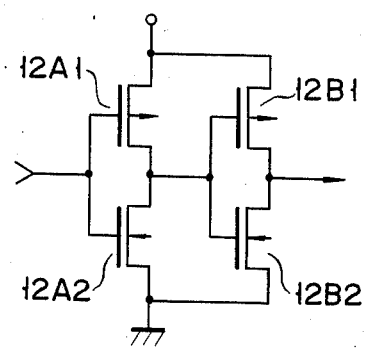
FIGS. 5 and 6 are circuit diagrams of two examples of the wave shaping circuit used in FIG. 4.
Figure 6:
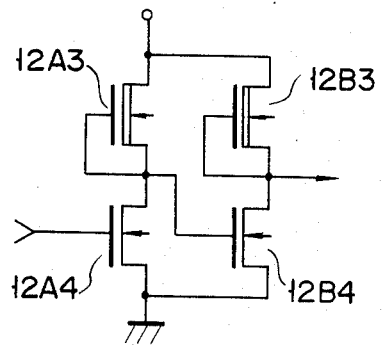

Two examples of the wave shaping circuit 12 are shown in FIGS. 5 and 6. The FIG. 5 circuit is a CMOS device including p-channel MOS transistors 12A1 and 12B1, and n-channel MOS transistors 12A2 and 12B2. The FIG. 6 circuit is an NMOS device including n-channel enhancement type MOS transistors 12A3 and 12B3, and n-channel depletion type MOS transistors 12A4 and 12B4.

Figure 7:
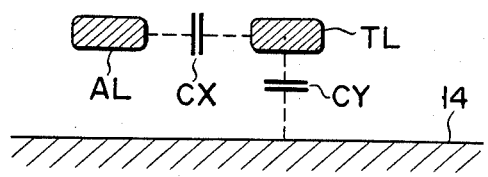
FIG. 7 illustrates stray capacitances existing between the transmission line, the auxiliary line and the substrate of the circuits of FIGS. 5 and 6.

FIG. 7 illustrates stray capacitances existing in these signal transmission circuits. CX denotes a stray capacitance existing between the transmission line TL and the auxiliary line AL. CY represents a stray capacitance existing between the transmission line TL and the semiconductor substrate 14. The transmission line TL is further coupled, at its output end, with a load capacitance of the internal circuit 10. In total, therefore, a large capacitor is coupled with the transmission line TL. Thus, the signal propagates through a signal transmission circuit that includes a large resistance protective resistor R and a large capacitance transmission line TL. This largely delays the signal transmission. Thus, when an input signal is rapidly changed, the potential on the transmission line TL changes at a rate relatively smaller than the rate of the signal change. On the other hand the auxiliary line AL is in a floating state at the far or output end. Therefore, the stray capacitance associated with the auxiliary line AL is considerably smaller than that associated with the transmission line TL.

The same signal as applied to the transmission line TL is applied to the input end of the auxiliary line AL after it is waveshaped by the wave shaping circuit 12. For this reason, the signal supplied to the auxiliary line AL changes at a greater rate of change, and in the same direction, as compared to the signal supplied to the transmission line TL. The stray capacitance associated with the auxiliary line AL is markedly smaller than that associated with the transmission line TL. The signal delay caused in the auxiliary line AL is smaller than that in the transmission line TL.

Figure 8:
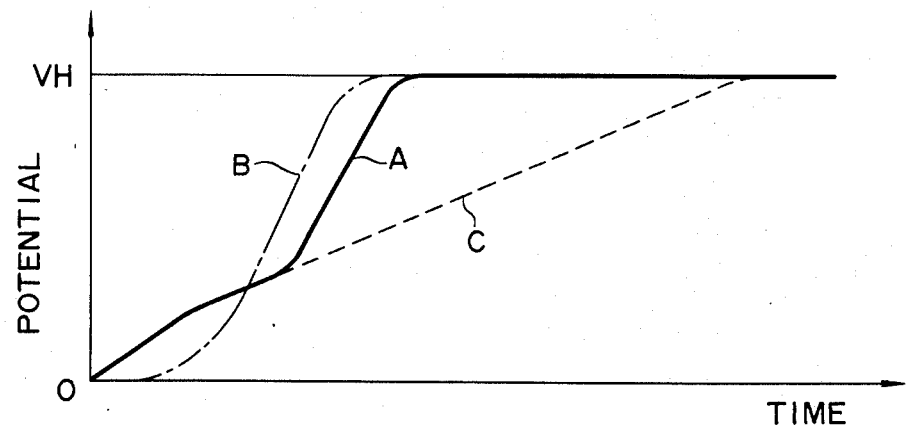
FIG. 8 shows the operating characteristics of the signal transmission circuits shown in FIGS. 1 and 4.

FIG. 8 illustrates how the potentials at the output ends of the lines AL and TL vary when a signal with a specific rise curve is supplied to the input terminal IT. In this case, the input signal is changed from "0" level to a predetermined level at time t0, and kept at the predetermined level. The output ends of the lines TL and AL are substantially equally distanced from the input terminal IT.

In FIG. 8, curve A, as depicted by a continuous line, represents a variation of the potential PT on the transmission line TL. Curve B, shown by a one-dot chain line, represents a variation of the potential PA on the auxiliary line AL. Curve C indicates a variation of the potential PL on the transmission line TL when the auxiliary line AL is not used.

As shown, the potential PA on the auxiliary line AL rises after a predetermined time from the rise of the potential PT on the transmission line TL. This is because the signal is delayed by the have shaping circuit 12. The potential PA rises as a relatively great rate, such that it then exceeds the potential PT. At this time, the effective value of the stray capacitance C2 existing between the lines TL and AL becomes small, as described in FIG. 3. Accordingly, the potential PT on the line TL rises at a larger variation rate toward the VH level, as shown by the curve A.

By setting the interval between the lines TL and AL to the minimum value tolerated in design, the between-line capacitance can be enlarged. In this case, due to a potential variation on the auxiliary line AL, it is possible to greatly reduce the effective value of the stray capacitance associated with the transmission line TL.

Figure 9:
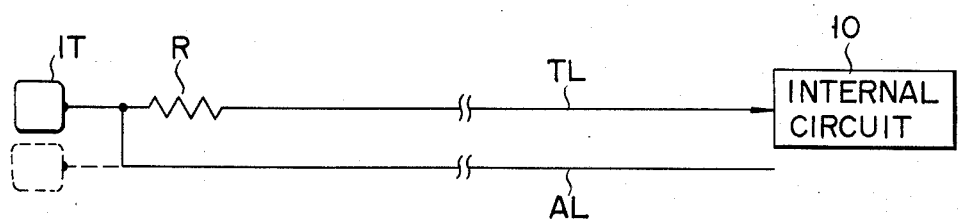
FIG. 9 is a circuit diagram of a signal transmission circuit according to another embodiment of the present invention.

FIG. 9, shows a signal transmission circuit according to another embodiment of the present invention. This embodiment is different from the FIG. 4 embodiment in the following respect. In this embodiment, the wave shaping circuit 12 is omitted by connecting the input end of the auxiliary line AL directly to the junction between the input terminal IT and the protective resistor R. A signal supplied to the input terminal IT is transmitted through the resistor R to the transmission line TL, and, at the same time, directly to the auxiliary line AL. Note here that if a high voltage signal is applied yo the input terminal IT and directly to the auxiliary line AL, it will not, under any circumstances, destroy the integrated circuit. The reason for this is that the output end of the auxiliary line AL is in an open state.

Because of the direct connection of the line AL to the terminal IT, the potential on the line AL quickly changes according to the input signal at the terminal IT. Further, since the wave shaping circuit 12 is not used in this circuit, the potential in the auxiliary line AL immediately changes in accordance with a change of the input signal. For example, when the input signal rapidly and sharply rises to the level VH, as in FIG. 8, the potential on the auxiliary line AL starts to rise at an earlier timing than in the case of FIG. 8.

The signal is applied through the protective resistor R to the transmission line TL. Therefore, the signal on the transmission line TL changes in accordance with a change in the input signal with a time delay. Accordingly, the potential PA on the auxiliary line AL starts to change at the same timing and in the same direction as the potential PT on the transmission line TL, and then changes at a greater rate of variation than the potential PT. Therefore, the effective value of the stray capacitance associated with the transmission line TL is reduced, so that the signal is quickly propagated to the internal circuit 10.

Figure 10:
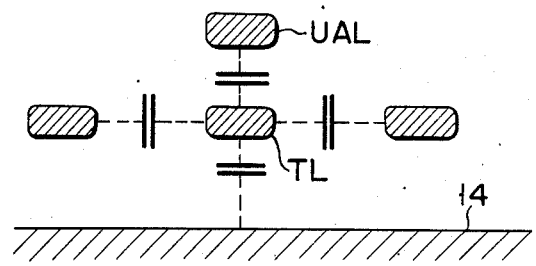
FIG. 10 shows stray capacitances existing between the transmission line, the substrate and auxiliary lines of FIG. 9 when the auxiliary lines are disposed on both sides of and above the transmission line.

It should be understood that the present invention is not limited to the two specific embodiments explained above. For example, in the above-mentioned embodiments, the auxiliary line AL is disposed in parallel on only one side of the transmission line TL. It may, however, be disposed on both sides of and/or above the transmission line TL. The example shown in FIG. 10 has the auxiliary lines AL on both sides of and above the transmission line TL. By laying an auxiliary line UAL above the transmission line TL with a thin insulating layer disposed therebetween, the capacitance between the lines TL and the line UAL can readily be increased. Therefore, the effective value of the capacitance can be reduced to considerably improve the signal transmission characteristic of the signal transmission circuit.

In a modification of the embodiment of FIG. 9, the input end of the auxiliary line AL is disconnected from the input terminal IT and connected to an additional input pad, as indicated by a broken line in FIG. 9. This modification, by supplying the same input signal as supplied to the input terminal IT to the additional pad, has the same useful effect as the FIG. 9 embodiment.

What is claimed is:

1. A signal transmission circuit comprising:
    a signal transmission line having a first stray capacitance formed on a semiconductor integrated circuit chip;
    an auxiliary line capacitively coupled with said transmission line and having a second stray capacitance; and
    signal supplying means for supplying a first input signal having a first rate of change to said transmission line, and for supplying, to the input end of said auxiliary line, a second input signal controlled by said first signal and including means so that said second signal rises or falls together with said first signal but at a second, faster, rate of change as compared to said first rate of change.

2. A signal transmission circuit according to claim 1, wherein said signal supplying means includes a signal input pad for receiving an input signal, and resistor means coupled between said signal input pad and said transmission line.

3. A signal transmission circuit according to claim 2, wherein said signal supplying means further includes waveshaping means connected at the input terminal to the junction between the input end of said transmission line and said resistor means, and at the output terminal to the input end of said auxiliary line.

4. A signal transmission circuit according to claim 3, wherein said auxiliary line includes one of multiple conductive lines formed on both sides of and above said transmission line, each of said conductive lines being connected at the input end to the output terminal of said waveshaping means, floating electrically at the output end, and extending substantially in parallel with said transmission line.

5. A signal transmission circuit according to claim 2, wherein said auxiliary line includes at least one of multiple conductive lines formed on both sides of and above said transmission line, each of said conductive lines being connected at the input end to the junction between said signal input pad and said resistor means, floating electrically at the output end, and extending in parallel with said transmission line.

6. A signal transmission circuit according to claim 2, wherein said signal supplying means has an additional input pad connected to the input end of said auxiliary line, said additional input pad receiving the same input signal as that supplied to said signal input pad.

7. A signal transmission circuit according to claim 6, wherein said auxiliary line includes at least one of multiple conductive lines formed on both sides of and above said transmission line, each of said conductive lines being connected at the input end to said additional input pad, floating electrically at the output end, and extending in parallel with said transmission line.

* * * * *